(12) United States Patent
Kumagai

(10) Patent No.: US 6,867,517 B2
(45) Date of Patent: Mar. 15, 2005

(54) RECTIFIER FOR ALTERNATOR HAVING RECTIFIER ELEMENT COVERED WITH RECTIFIER TERMINAL

(75) Inventor: Satoshi Kumagai, Toyokawa (JP)

(73) Assignee: Denso Corporation, Kariya (JP)

( * ) Notice: Subject to any disclaimer, the term of this patent is extended or adjusted under 35 U.S.C. 154(b) by 65 days.

(21) Appl. No.: 10/368,646

(22) Filed: Feb. 20, 2003

(65) Prior Publication Data

US 2003/0178900 A1 Sep. 25, 2003

(30) Foreign Application Priority Data

Mar. 19, 2002 (JP) ........................................ 2002-076193

(51) Int. Cl.⁷ .............................................. H02K 11/00
(52) U.S. Cl. ..................................... 310/68 D; 310/71
(58) Field of Search ............................. 310/68 D, 71; 363/142, 145

(56) References Cited

U.S. PATENT DOCUMENTS

| | | | |
|---|---|---|---|
| 3,739,210 A | 6/1973 | Bahlinger et al. | 310/68 D |
| 4,137,560 A | 1/1979 | Moore | 310/68 D |
| 5,043,614 A * | 8/1991 | Yockey | 310/68 D |
| 6,184,602 B1 * | 2/2001 | Ooiwa et al. | 310/68 D |
| 6,476,527 B2 * | 11/2002 | Ballard et al. | 310/68 D |

FOREIGN PATENT DOCUMENTS

| | | | | |
|---|---|---|---|---|
| FR | 2 275 057 A | 1/1976 | | H02M/5/20 |
| GB | 1 381 858 A | 1/1975 | | H01L/25/04 |
| JP | A-2001-231233 | 8/2001 | | H02K/19/36 |

\* cited by examiner

*Primary Examiner*—Dang Le
*Assistant Examiner*—Nguyen Hanh
(74) *Attorney, Agent, or Firm*—Oliff & Berridge, PLC

(57) ABSTRACT

A rectifier of an alternator includes positive and negative rectifier elements. Each rectifier element has a lead wire connected thereto, and a vicinity of a portion connecting the lead wire to the element is sealed with a material such as resin or rubber, forming a sealing portion. To protect the sealing portion against harmful components contained in cooling air blown to the rectifier, a conically shaped terminal connected to the lead wire is disposed to face and cover the sealing portion. The terminal has a sufficiently large surface area for dissipating heat generated in a process of connecting the lead wire to the terminal by welding.

7 Claims, 5 Drawing Sheets

FRONT SIDE ←→ REAR SIDE

FRONT SIDE ← → REAR SIDE

FRONT SIDE ⟵⟶ REAR SIDE

RECTIFIER FOR ALTERNATOR HAVING RECTIFIER ELEMENT COVERED WITH RECTIFIER TERMINAL

CROSS-REFERENCE TO RELATED APPLICATION

This application is based upon and claims benefit of priority of Japanese Patent Application No. 2002-76193 filed on Mar. 19, 2002, the content of which is incorporated herein by reference.

BACKGROUND OF THE INVENTION

1. Field of the Invention

The present invention relates to a rectifier for an alternator for use in an automotive vehicle.

2. Description of Related Art

A conventional rectifier 5 for an automotive alternator 1 is shown in FIGS. 5–7. As shown in FIG. 5, the rectifier 5 includes a positive heat-sink plate 51, a negative heat-sink plate 52, a terminal base 55, a rectifier terminal 257, a resin spacer 58 and other associated components. As shown in FIGS. 6 and 7, a positive rectifier element 53 is inserted into a through-hole 83 of the positive heat-sink plate 51, and a negative rectifier element 54 inserted into a through-hole 83 of the negative heat-sink plate 52. Lead wires 531, 541 are soldered to the rectifier elements 53, 54, respectively, and the soldered portions are sealed by respective sealing portions 61.

The rectifier terminal 257 is connected by molding to the terminal base 55 having a cylindrical portion 62 through which a bolt 59 is inserted. The negative heat-sink plate 52, the resin spacer 58, the positive heat-sink plate 51 and the terminal base 55 are laminated in this order and fixed to a rear housing 42 by the bolt 59 and a nut 60. A rectifier terminal 257 is connected by welding to the lead wire 531 of the positive rectifier element 53, and another rectifier terminal 257 is connected by welding to the lead wire 541 of the negative rectifier element 54. Further, a portion of the rectifier terminal 257 is connected by welding to a stator lead 23 constituting a phase terminal of a stator coil 22. The rectifier 5 is cooled by a rear fan 37 connected to a rear side of a rotor 3.

Since the sealing portion 61 of the rectifier elements 53, 54 is not covered with the rectifier terminal 257 in the conventional rectifier 5 described above, cooling air containing moisture and salt is directly blown to the sealing portion 61 formed by resin or rubber. Therefore, there has been a problem that the sealing portion 61 is deteriorated by the moisture and the salt contained in the cooling air. Heat generated by welding in a process of connecting the lead wires 531, 541 to the rectifier terminals 257 is transferred to the heat-sink plates 51, 52. However, a size of the rectifier terminal 257 of the conventional rectifier is not large enough to sufficiently dissipate the heat and to protect rectifier elements 53, 54 from the welding heat. Therefore, a heat-dissipating jig is attached to the lead wires 531, 541 in the welding process to enhance heat dissipation. Attaching the heat-dissipating jig to the lead wires 531, 541 requires an additional step in the welding process. This has been another problem involved in the conventional rectifier. Further, it has been troublesome to correctly position the lead wires 531, 541 relative to the rectifier terminal 257 in the welding process, because the rectifier terminal 257 is plate-shaped and has no hole for inserting the lead wires 531, 541.

SUMMARY OF THE INVENTION

The present invention has been made in view of the above-mentioned problems, and an object of the present invention is to provide an improved rectifier in which sealing portions of rectifier elements are well protected against harmful components contained in cooling air. Another object of the present invention is to provide a rectifier terminal that is easily assembled with rectifier elements.

A rectifier for rectifying alternating current generated in an armature coil into direct current is mounted on an alternator for use in an automotive vehicle. The rectifier includes positive rectifier elements and negative rectifier elements. Each rectifier element has a semiconductor element and a lead wire connected to the semiconductor element. A portion connecting the semiconductor element to the lead wire is sealed by a material such as resin or rubber, forming a sealing portion. The lead wire extends toward a rear side of the alternator from which cooling air is blown to the rectifier. A rectifier terminal is connected to the lead wire by welding.

The cooling air often contains harmful components such as moisture or salt particles. If the cooling air directly hits the sealing portion, the sealing portion is deteriorated by the harmful components contained in the cooling air. In order to prevent the cooling air from directly hitting the sealing portion, the rectifier terminal is disposed to face and cover an entire surface of the sealing portion.

Preferably, the rectifier terminal is formed in a hollow conical shape having a connecting hole for inserting the lead wire. The connecting hole is formed so that its diameter gradually decreases in a direction of inserting the lead wire. Thus, the lead wire is easily inserted into the connecting hole to pass through an entire length of the connecting hole. Further, the rectifier terminal is formed to have a sufficient surface area for dissipating heat generated in a process of welding the lead wire and the rectifier terminal.

The positive rectifier element and the negative rectifier element may be disposed to face each other in order to shorten an axial length of the rectifier. In this case, only the lead wire extending toward the rear side from which the cooling air is blown is covered by the conical rectifier terminal.

According to the present invention, the sealing portion is protected against the harmful components contained in the cooling air. Further, the lead wire can be easily inserted into the connecting hole, and heat generated in the process of welding the rectifier terminal and the lead wire is effectively dissipated.

Other objects and features of the present invention will become more readily apparent from a better understanding of the preferred embodiments described below with reference to the following drawings.

DETAILED DESCRIPTION OF THE PREFERRED EMBODIMENTS (First Embodiment)

Figure 1:
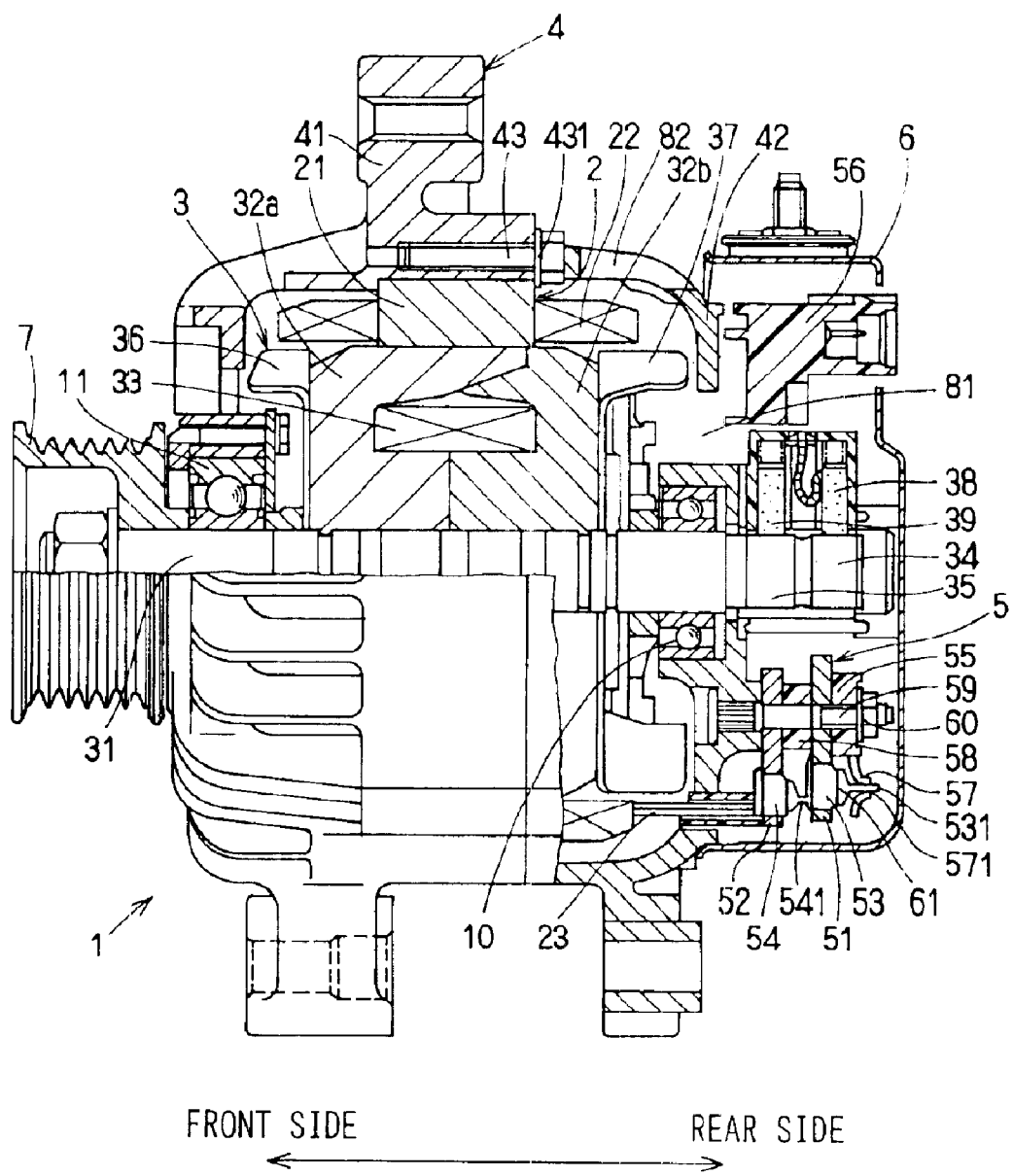
FIG. 1 is a cross-sectional view showing an alternator on which a rectifier as a first embodiment of the present invention is mounted.
Figure 2:
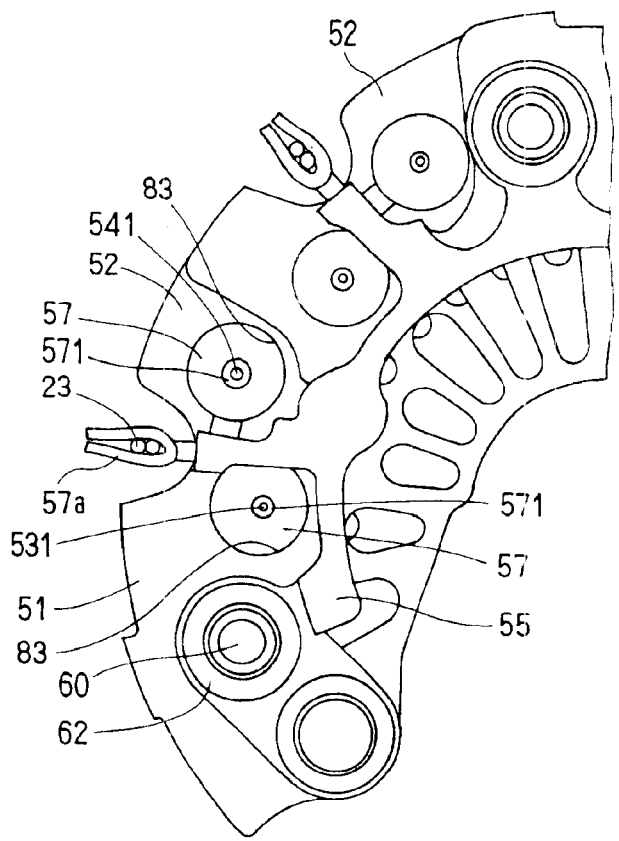
FIG. 2 is a plan view partly showing the rectifier, viewed from a rear side (shown in FIG. 1) of the alternator.

A first embodiment of the present invention will be described with reference to FIGS. 1–3. First, referring to FIG. 1, an entire structure of an alternator 1 will be described. The alternator 1 is composed of a stator 2, a rotor 3, a housing 4, a rectifier 5, a voltage regulator 56, a rear cover 6, a pulley 7 and other associated components. The stator 2 includes a stator core 21 and a stator coil 22. The stator core 21 is formed by laminating plural steel plates, and plural slots (not shown) are formed inside the stator core 21. The stator coil 22 is inserted into the slots of the stator core 21. The stator coil 22 generates alternating voltage according to rotation of the rotor 3.

The rotor 3 is composed of a rotor shaft 31, a pair of rotor cores 32a, 32b, a rotor coil 33, a pair of slip-rings 34, 35, a front cooling fan 36 and a rear cooling fan 37. The pair of rotor cores 32a, 32b is fixed to the rotor shaft 31, forming a Landell-type core. The rotor coil 33 is formed by winding an insulated wire around a center boss of the rotor cores 32a, 32b and is disposed between the pair of rotor cores 32a, 32b. The front cooling fan 36 having slanted blades is fixed to a front end surface of the rotor core 32a by spot-welding or the like. The front cooling fan 36 sucks outside air through front side windows and blows out the cooling air in both radial and axial directions. The rear cooling fan 37 having blades is fixed to a rear end surface of the rotor core 32b. Cooling air sucked by the rear cooling fan 37 through inlet windows 81 is blown out in the radial direction through outlet windows 82, thereby cooling down the rectifier 5 and other components disposed at the rear side of the rotor 3.

The housing 4 is composed of a cup-shaped front housing 41 and a cup-shaped rear housing 42 connected to each other by bolts (not shown). The housing 4 contains and supports therein the stator 2, the rotor 3 and other components. The rotor shaft 31 is rotatably supported by a bearing 11 held in the front housing 41 and another bearing 10 held in the rear housing 42. A pair of slip-rings 34, 35 electrically connected to ends of the rotor coil 33 is fixed to a vicinity of the rear end of the rotor shaft 31. Electric current is supplied to the rotor coil 33 from brushes 38, 39 slidably contacting the slip-rings 34, 35. A front end of the stator core 21 abuts an inner wall of the front housing 41, and its rear end abuts a flange 431 of a bolt 43 screwed to the rear housing 42. Thus, the stator core 21 is held in the housing 4. The rectifier 5 is disposed outside the rear housing 42 and covered by a rear cover 6.

Now, the rectifier 5 will be described with reference to FIGS. 1–3. The rectifier 5 includes a positive heat-sink plate 51, a negative heat-sink plate 52, a positive rectifier element 53, a negative rectifier element 54, a terminal base 55 and rectifier terminal 57, a resin spacer 58 and other components. The positive rectifier element 53 is inserted into a through-hole 83 of the positive heat-sink plate 51, and similarly the negative rectifier element 54 is inserted into a through-hole 83 of the negative heat-sink plate 52. The positive rectifier element 53 has a lead wire 531 connected to the element by welding, and the connected portion is covered and sealed by a sealing portion 61. Similarly, the negative rectifier element 54 has a lead wire 541 connected to the element by welding, and the connected portion is covered and sealed by a sealing portion 61. The sealing portion 61 is made of resin or rubber. The rectifier 5 rectifies alternating current generated in the stator coil 22 into direct current, and the rectified direct current is supplied to an on-board battery (not shown). In the first embodiment, both rectifier elements 53, 54 are disposed so that their lead wires 531 and 541 extend in the same direction toward the rear side of the alternator.

The rectifier terminal 57 is integrally connected by molding to the terminal base 55 having a cylindrical portion 62 into which a bolt 59 is inserted. The negative heat-sink plate 52, the resin spacer 58, the positive heat-sink plate 51 and the terminal base 55 are laminated in this order and fixed to a rear housing 42 by the bolt 59 and a nut 60. As better seen in FIG. 3, one rectifier terminal 57 is connected by welding to the lead wire 531 extending from an anode of the positive rectifier element 53, and another rectifier terminal 57 is connected by welding to the lead wire 541 extending from a cathode of the negative rectifier element 54. A terminal 57a constituting a part of the rectifier terminal 57 is connected by welding to a stator lead 23 forming a phase terminal of the stator coil 22.

The voltage regulator 56 for controlling an output voltage of the alternator 1 to a predetermined level is disposed outside of the rear housing 42. The rear cover 6 made of an aluminum plate is connected to the rear housing 42, so that the rectifier 5, the voltage regulator 56 and brushes 38, 39 are covered and protected by the rear cover 6. Inlet windows (not shown) for introducing cooling air are formed at the rear end of the rear cover 6. The pulley 7 is fixed to the front end of the rotor shaft 31. The alternator 1 is driven by an automotive engine via a belt coupling the pulley 7 and the engine.

Figure 3:
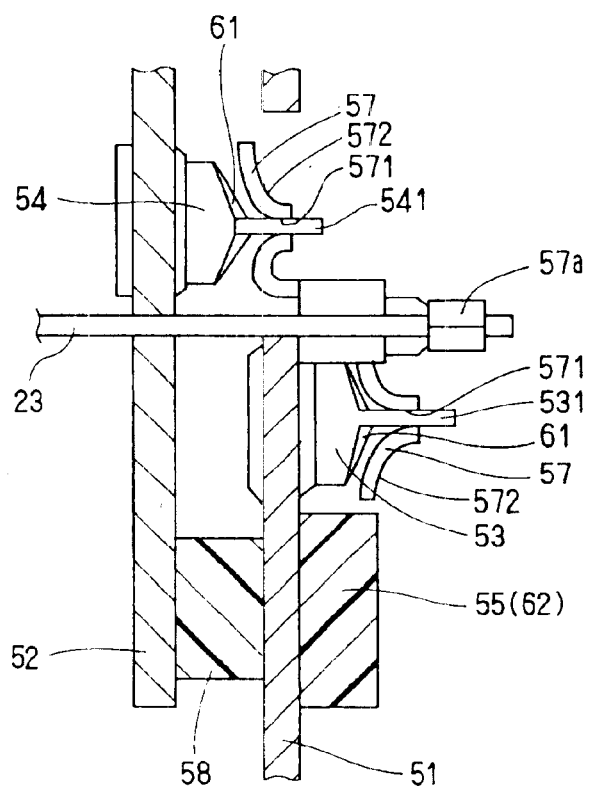
FIG. 3 is a cross-sectional view showing the rectifier shown in FIG. 2.

Referring to FIG. 3, the structure of the rectifier 5 will be explained further in detail. The rectifier terminal 57 formed in a conical shape is disposed to face an entire surface of the sealing portion 61 of the rectifier elements 53, 54. The lead wire 531 of the positive rectifier element 53 is inserted into a connecting hole 571 of the rectifier terminal 57 and electrically connected thereto by welding. Similarly, the lead wire 541 of the negative rectifier element 54 is inserted into a connecting hole 571 of the rectifier terminal 57 and electrically connected thereto by welding. The connecting hole 571 is formed in a conical shape so that its diameter gradually decreases in the direction of inserting the lead wire 531, 541. The conical outer surface of the rectifier terminal 57 is formed in a shape of a concave surface 572. An anode of the positive rectifier element 53 is connected to the rectifier terminal 57, and its cathode is connected to the positive heat-sink plate 51. A cathode of the negative rectifier element 54 is connected to the rectifier terminal 57, and its anode is connected to the negative heat-sink plate 52.

Following advantages are attained in the first embodiment described above. Since the conical rectifier terminal 57 is disposed to face and cover an entire surface of the sealing portion 61 of the rectifier elements 53, 54, the cooling air containing moisture and salt does not directly hit the sealing portion 61. In other words, the sealing portion 61 is protected against the cooling air containing moisture and salt. Therefore, deterioration of the sealing portion 61 is suppressed.

Since the connecting hole 571 of the rectifier terminal 57 has a conical shape gradually narrowed in the direction of inserting the lead wire 531, 541, the lead wire 531, 541 can be easily inserted into the connecting hole 571 even if the lead wire is not exactly aligned with the connecting hole 571. Therefore, the process of assembling the rectifier 5 can be easily carried out.

Since the rectifier terminal 57 is made sufficiently large in size to cover the entire surface of the sealing portion 61, heat generated in the welding process for connecting the lead wire 531, 541 to the rectifier terminal 57 can be sufficiently dissipated by the rectifier terminal 57. Therefore, it is not necessary to attach a heat dissipating jig to the lead wire 531, 541 in the welding process. Thus, the welding process can be simplified. Further, since the lead wire 531, 541 is inserted into the connecting hole 571 to completely pass therethrough, the welding can be easily carried out.

Though the rectifier 5 is disposed outside the rear housing 42 and covered by the rear cover 6 in the embodiment described above, it is also possible to disposed the rectifier 5 in the rear housing 42 to be covered by the rear housing 42.

(Second Embodiment)

Figure 4:
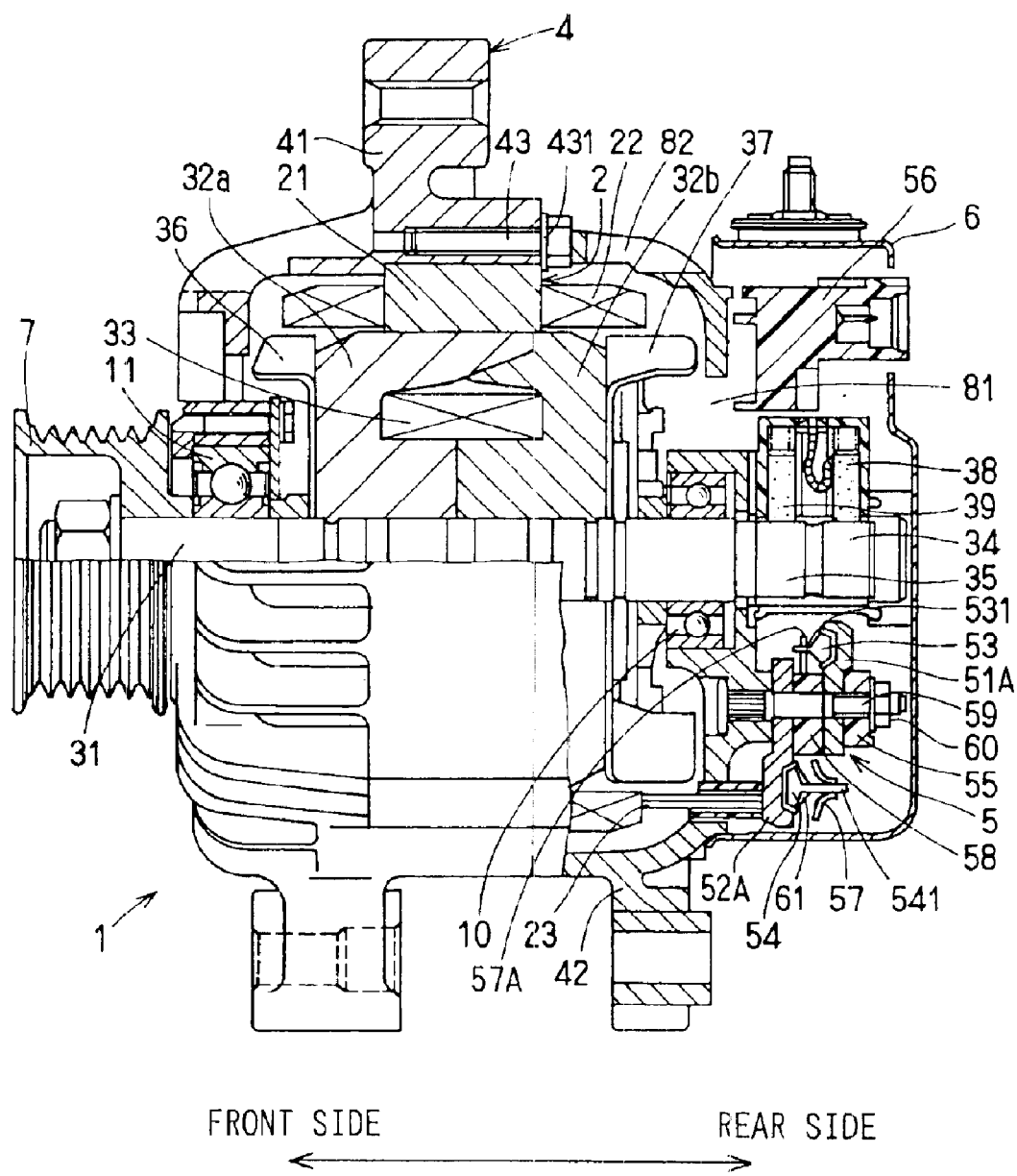
FIG. 4 is a cross-sectional view showing an alternator on which a rectifier as a second embodiment of the present invention is mounted.
Figure 5:
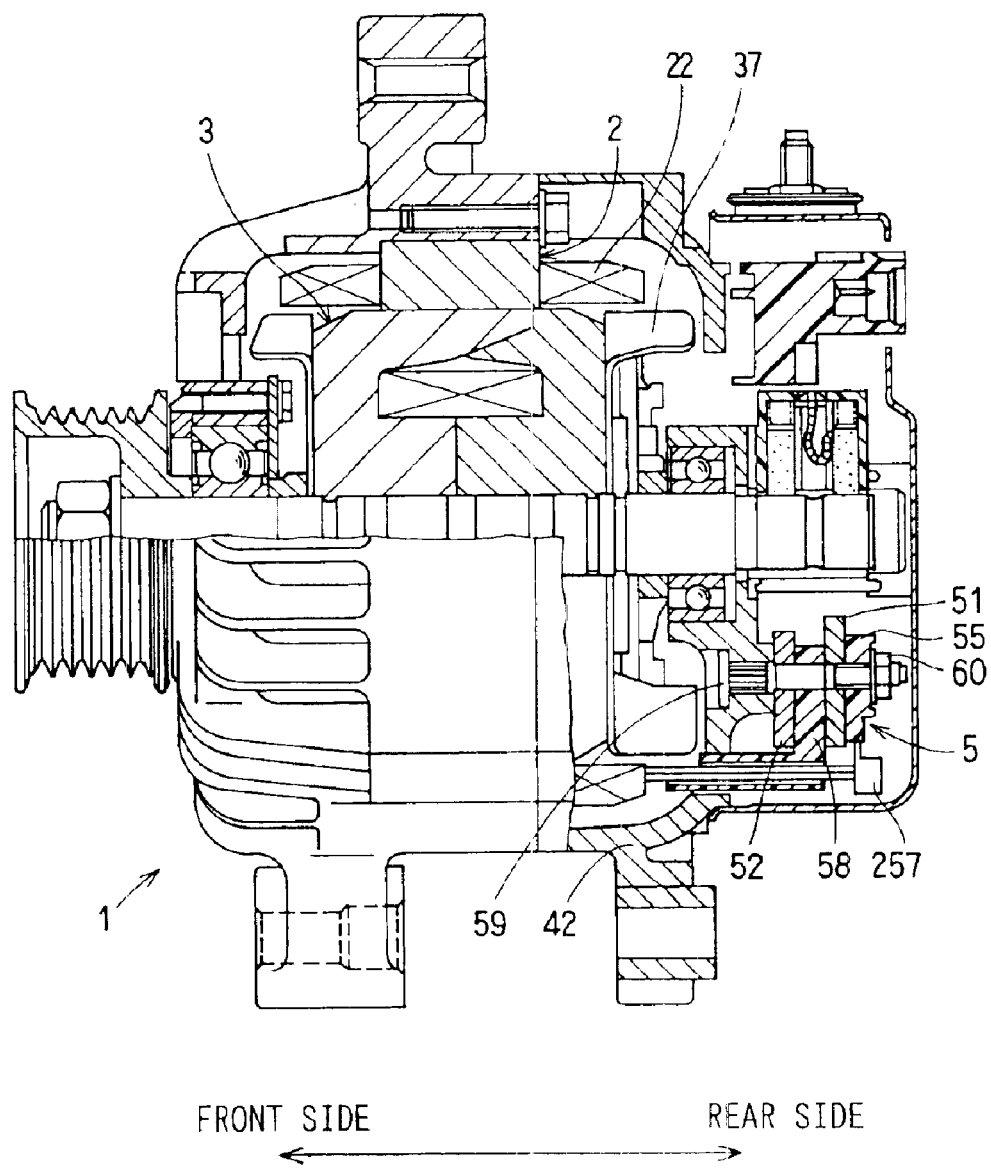
FIG. 5 is a cross-sectional view showing a conventional alternator on which a conventional rectifier is mounted.
Figure 6:
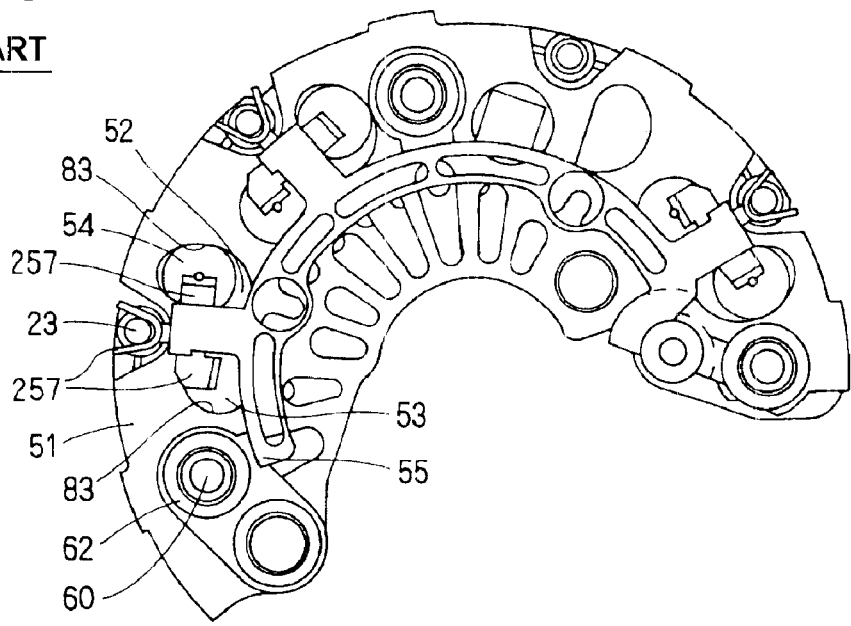
FIG. 6 is a plan view showing the conventional rectifier used in the alternator shown in FIG. 5, viewed from a rear side (shown in FIG. 5) of the alternator.
Figure 7:
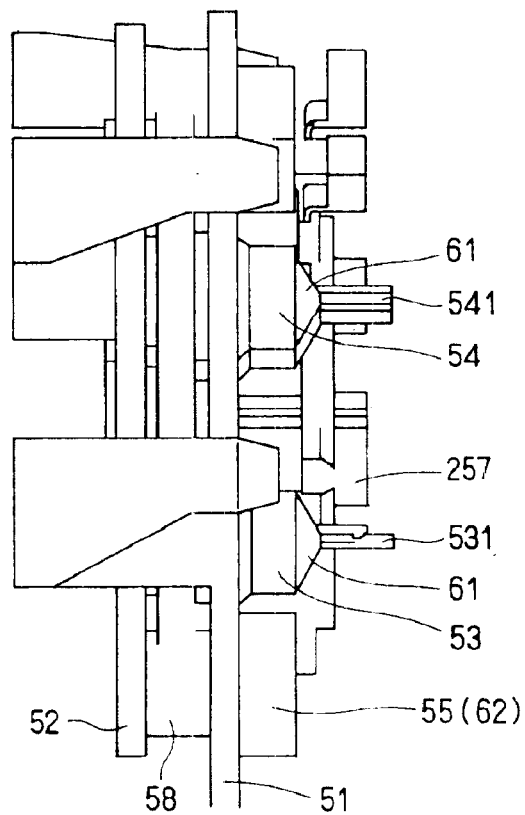
FIG. 7 is a side view showing the conventional rectifier shown in FIG. 6.

A second embodiment of the present invention will be described with reference to FIG. 4. In this embodiment, the rectifier elements 53, 54 are positioned in a modified manner, and the positive and negative heat-sink plates 51, 52 used in the first embodiment are slightly modified to heat-sink plates 51A, 52A. Other structures are the same as those of the first embodiment described above.

The positive rectifier element 53 is fixed to a depression formed on the positive heat-sink plate 51A and disposed so that its lead wire 531 extends toward the front side. The negative rectifier element 54 is fixed to a depression formed on the negative heat-sink plate 52A and disposed so that its lead wire 541 extends toward the rear side. That is, the rectifier elements 53, 54 are positioned to face each other, and their lead wires 531, 541 extend in directions opposite to each other. A rectifier terminal 57A connected to the positive rectifier element 53 is not formed in a conical shape but in a flat shape. Another rectifier terminal 57 connected to the negative rectifier element 54 is formed in the same conical shape as in the first embodiment.

The cooling air introduced from the rear side of the rear cover 6 does not directly hit the sealing portion 61 of the positive rectifier element 53 because its sealing portion 61 does not face the rear side. On the other hand, the cooling air directly hits the sealing portion 61 of the negative rectifier element 54 because its sealing portion 61 faces the rear side. Therefore, it is necessary to cover the sealing portion 61 of the negative rectifier element 54 with the conical rectifier terminal 57, but it is not necessary to cover the sealing portion 61 of the positive rectifier element 53 with the conical rectifier terminal. Accordingly, the lead wire 531 of the positive rectifier element 53 is connected to the flat rectifier terminal 57A.

As to suppression of deterioration of the sealing portion 61, the same advantage as in the first embodiment can be attained in this second embodiment, too. In addition, a distance between the positive heat-sink plate 51A and the negative heat-sink plate 52A can be made short by disposing the positive and negative rectifier elements 53, 54 to face each other as shown in FIG. 4. This contributes to shortening an axial length of the alternator.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A rectifier for an automotive alternator, the rectifier comprising:

a rectifier element having a lead wire electrically connected to the rectifier element, the rectifier element being sealed by sealing portion formed around a position where the rectifier element is connected to the lead wire;

a heat-sink plate for mounting the rectifier element thereon and dissipating heat generated in the rectifier element;

a rectifier terminal connected to the lead wire; and a terminal base supporting the rectifier terminal, wherein:
the rectifier terminal is disposed to face an entire surface of the sealing portion so that the sealing portion is covered with the rectifier terminal, and
the terminal base is disposed not to cover the rectifier element so that cooling air directly hits the rectifier terminal.

2. The rectifier for an automotive alternator as in claim 1, wherein:
the rectifier terminal is connected to the lead wire by welding.

3. A rectifier for an automotive alternator, the rectifier comprising:

a rectifier element having a lead wire electrically connected to the rectifier element, the rectifier element being sealed by sealing portion formed around a position where the rectifier element is connected to the lead wire;

a heat-sink plate for mounting the rectifier element thereon and dissipating heat generated in the rectifier element; and a rectifier terminal connected to the lead wire, wherein:
the rectifier terminal is disposed to face an entire surface of the sealing portion so that the sealing portion is covered with the rectifier terminal, and
the rectifier terminal is formed in a hollow conical shape having a base widened toward the sealing portion and a concave outer surface.

4. The rectifier for an automotive alternator as in claim 3, wherein:
the rectifier terminal includes a connecting hole into which the lead wire is inserted, the connecting hole being formed at a top portion of the conical shape so that a diameter of the connecting hole gradually decreases in a direction of inserting the lead wire.

5. The rectifier for an automotive alternator as in claim 4, wherein:
the lead wire is inserted into the connecting hole so that the lead wire passes through the connecting hole.

6. The rectifier for an automotive alternator as in claim 1, wherein:
the rectifier element comprises a positive rectifier element and a negative rectifier element; and
both rectifier elements are disposed so that the lead wire of the positive rectifier element extends toward the negative rectifier element and the lead wire of the negative rectifier element extends toward the positive rectifier element.

7. The rectifier for an automotive alternator as in claim 6, wherein:
the lead wire of either the positive rectifier element or the negative rectifier element extends toward a rear side of the alternator; and
only the rectifier terminal connected to the lead wire extending toward the rear side of the alternator is disposed to face the entire surface of the sealing portion of the rectifier element.

* * * * *